United States Patent
Asakawa et al.

(10) Patent No.: US 8,481,246 B2
(45) Date of Patent: Jul. 9, 2013

(54) METHOD OF FORMING PATTERN

(75) Inventors: Koji Asakawa, Kawasaki (JP); Shigeki Hattori, Kawasaki (JP); Ryota Kitagawa, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/430,185

(22) Filed: Mar. 26, 2012

(65) Prior Publication Data

US 2012/0244474 A1 Sep. 27, 2012

Related U.S. Application Data

(63) Continuation of application No. PCT/JP2009/066982, filed on Sep. 29, 2009.

(51) Int. Cl.
*G03C 5/00* (2006.01)

(52) U.S. Cl.
USPC ........... 430/296; 430/311; 430/322; 430/942; 430/945; 216/62

(58) Field of Classification Search
USPC ............. 430/296, 311, 322, 942, 945; 216/62
See application file for complete search history.

(56) References Cited

U.S. PATENT DOCUMENTS

| | | | |
|---|---|---|---|
| 6,565,763 B1 | 5/2003 | Asakawa et al. |
| 6,565,764 B2 | 5/2003 | Hiraoka et al. |
| 7,090,784 B2 | 8/2006 | Asakawa et al. |
| 7,097,781 B2 | 8/2006 | Asakawa et al. |
| 7,517,466 B2 | 4/2009 | Asakawa et al. |
| 8,039,196 B2 | 10/2011 | Kim et al. |
| 8,043,520 B2 | 10/2011 | Asakawa et al. |
| 2005/0145864 A1 | 7/2005 | Sugiyama et al. |
| 2012/0037594 A1 | 2/2012 | Asakawa et al. |
| 2012/0037595 A1 | 2/2012 | Asakawa et al. |
| 2012/0041121 A1 | 2/2012 | Asakawa et al. |

FOREIGN PATENT DOCUMENTS

| | | |
|---|---|---|
| JP | 2002-060519 | 2/2002 |
| JP | 2002-287377 | 10/2002 |
| JP | 2003-218383 | 7/2003 |
| JP | 2005-284100 | 10/2005 |
| JP | 2009-042760 | 2/2009 |

OTHER PUBLICATIONS

International Search Report issued Oct. 27, 2009 in PCT/JP2009/066982 filed Sep. 29, 2009.

Sang Ouk Kim, et al.; "Epitaxial self-assembly of block copolymers on lithographically defined nanopatterned substrates"; Nature, 2003, vol. 424, pp. 411-414.

Mingqi Li, et al.; "Spatially Controlled Fabrication of Nanoporous Block Copolymers"; Chem. Mater., 2004, vol. 16, No. 20, pp. 3800-3808.

*Primary Examiner* — Christopher Young

(74) *Attorney, Agent, or Firm* — Oblon, Spivak, McClelland, Maier & Neustadt, L.L.P.

(57) ABSTRACT

According to one embodiment, a method of forming a pattern includes applying a block copolymer to a substrate, the block copolymer including a first block and a second block, the first block including polyacrylate or polymethacrylate having a side chain to which an alicyclic hydrocarbon group or a hydrocarbon group including a tertiary carbon is introduced, and the second block including polystyrene substituted with hydrocarbon or halogen at an α-position, causing the block copolymer to be phase-separated, irradiating the block copolymer with an energy beam to decompose the second block, and removing the second block with a developer to form a pattern of the first block.

9 Claims, 2 Drawing Sheets

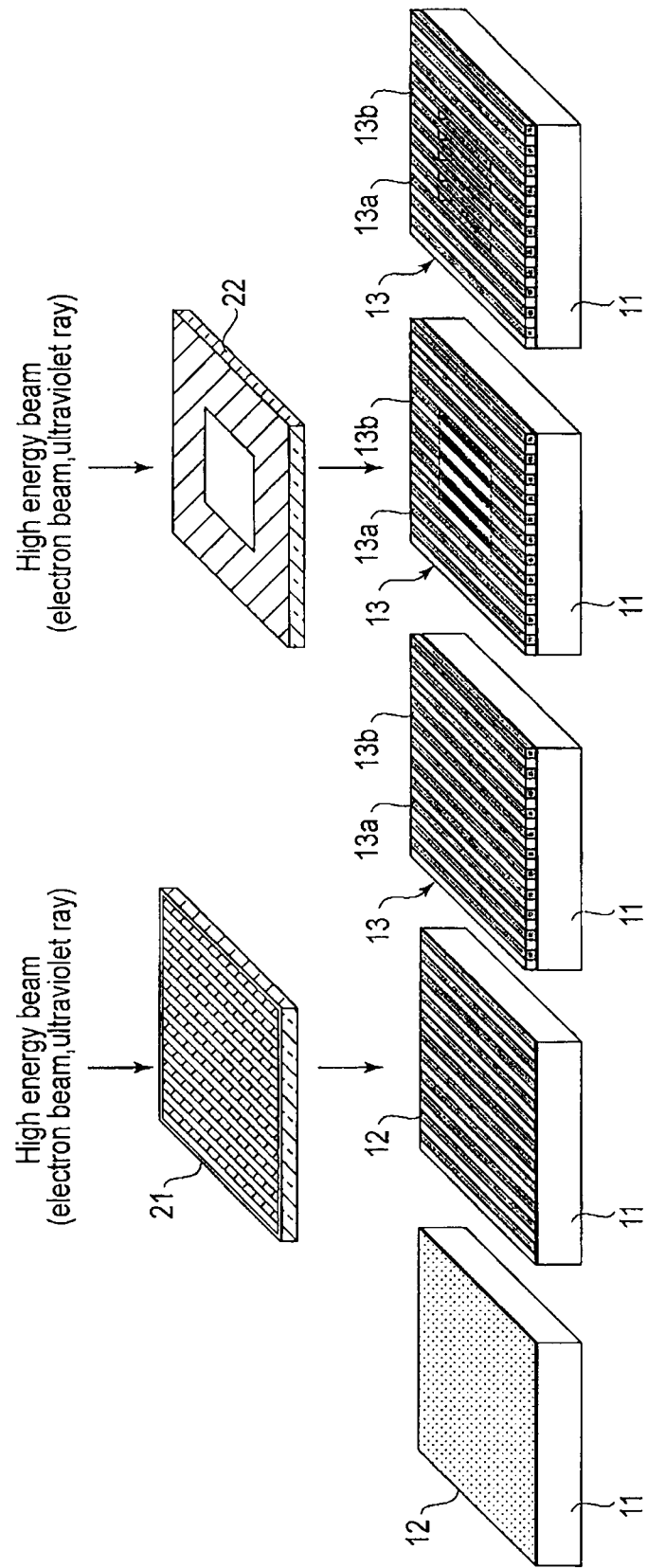

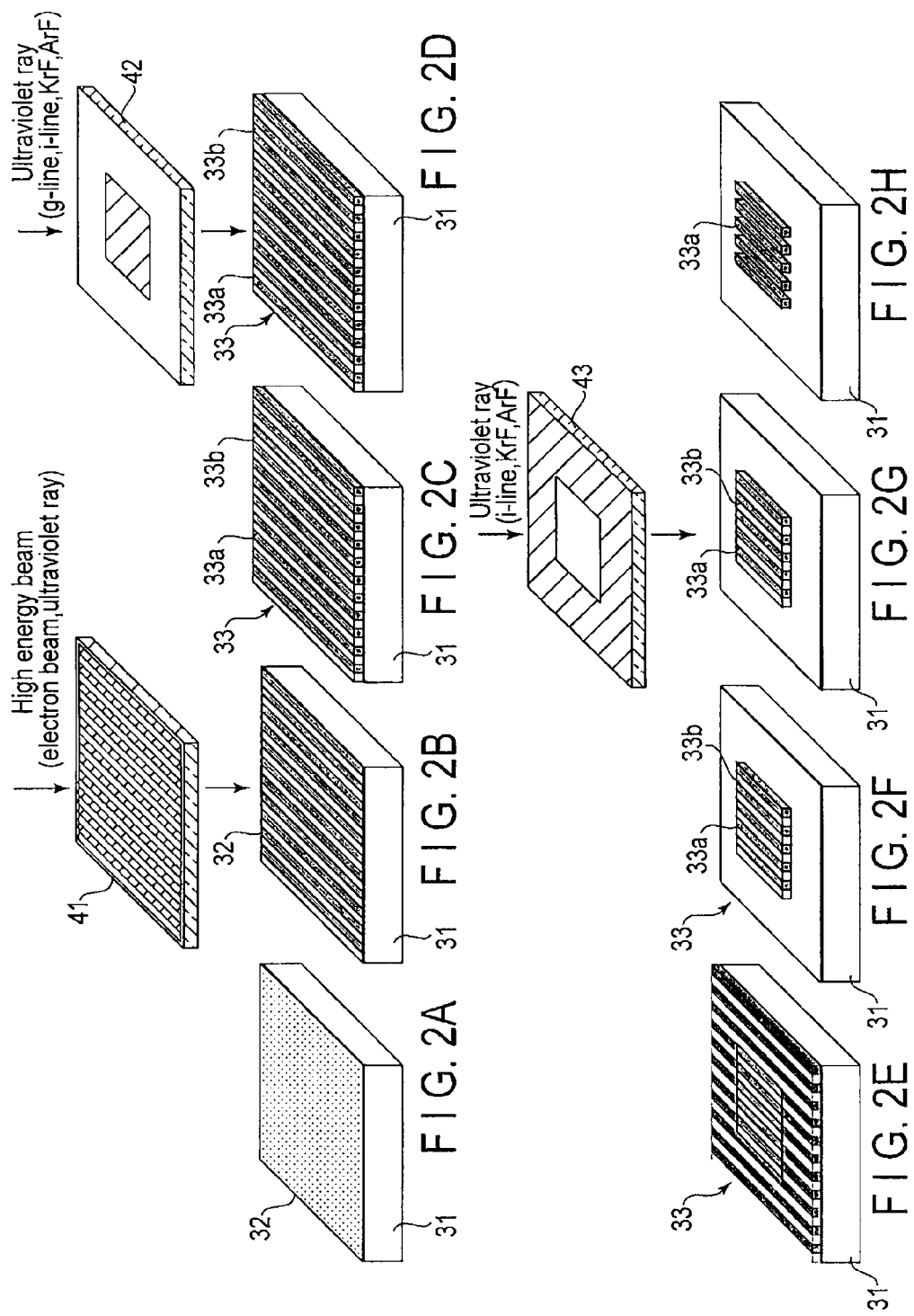

METHOD OF FORMING PATTERN

CROSS-REFERENCE TO RELATED APPLICATIONS

This application is a Continuation Application of PCT Application No. PCT/JP2009/066982, filed Sep. 29, 2009, the entire contents of which are incorporated herein by reference.

FIELD

Embodiments described herein relate generally to a method of forming a pattern used for manufacturing electronic parts.

BACKGROUND

In order to form a circuit pattern of electronic parts, for example, a semiconductor device and a display, and so on, a lithography technique has been used in which the pattern is fabricated by exposing a resist to light through a photomask and developing the resist. Under the present circumstances, with a growing demand for microfabrication, shortening the wavelength of a light source and increasing the size of an optical projection system have been proceeded to improve resolution. The resolution can further be improved by using an immersion technique, a super-resolution technique, and chemical mechanical polishing (CMP). However, according to the microfabrication by top-down approach, which has been the mainstream technique thus far, expensive apparatuses and materials need to be used for a smaller processing size, leading to requirement of massive investments.

On the other hand, studies of bottom-up techniques such as use of self-assembly of molecules have been developing. From the viewpoint of affinity with semiconductor processes, lithography using self-assembled patterns of a block copolymer as masks has been attracting a lot of attention. The present inventors have proposed a method of forming a pattern using a block copolymer as a template based on a difference in dry etching resistance between the blocks. However, it is found that patterns in the order of 10 nm or less are hard to be formed by only using the difference in dry etching resistance between the two blocks.

Further, in order to use the block copolymer for patterning wires of, for example, a semiconductor memory, patterns of the block copolymer need to be aligned in predetermined positions in a self-assembled manner. Thus, the studies have been made to achieve the needs. That is, considering the application to fabrication of semiconductor devices, only particular portions of the patterns of the block copolymer, such as those portions corresponding to wires, need to be removed by some means of exposure and other methods.

BRIEF DESCRIPTION OF THE DRAWINGS

FIGS. 1A, 1B, 1C, 1D and 1E are perspective views showing processes of forming a pattern in Example 1; and
FIGS. 2A, 2B, 2C, 2D, 2E, 2F, 2G and 2H are perspective views showing processes of forming a pattern in Example 2.

DETAILED DESCRIPTION

In general, according to one embodiment, a method of forming a pattern includes applying a block copolymer to a substrate, the block copolymer including a first block and a second block, the first block including polyacrylate or polymethacrylate having a side chain to which an alicyclic hydrocarbon group or a hydrocarbon group including a tertiary carbon is introduced, and the second block including polystyrene substituted with hydrocarbon or halogen at an α-position, causing the block copolymer to be phase-separated, irradiating the block copolymer with an energy beam to decompose the second block, and removing the second block with a developer to form a pattern of the first block.

In the embodiments, used is a block copolymer comprising: a first block comprising polyacrylate or polymethacrylate having a side chain to which an alicyclic hydrocarbon group or a hydrocarbon group comprising a tertiary carbon is introduced; and a second block comprising polystyrene substituted with hydrocarbon or halogen at an α-position.

The second block comprises polystyrene substituted with hydrocarbon or halogen at the α-position, and the main chain thereof is decomposed when irradiated with a high energy beam such as an electron beam and an ultraviolet ray. The first block comprises polyacrylate or polymethacrylate having a side chain to which an alicyclic hydrocarbon group or a hydrocarbon group comprising a tertiary carbon, and the block is not decomposed even when irradiated with the energy beam.

The second block comprises polystyrene substituted with alkyl groups such as a methyl group and an ethyl group or halogen such as chlorine and fluorine at the α-position. It is known that the main chain of a polymer substituted with hydrocarbon or halogen at the α-position is decomposed when irradiation with an energy beam. It is preferable for the second block to be decomposed efficiently from an industrial viewpoint. As for the second block, a benzene ring in the side chain absorbs i-line, which is an emission line of a mercury-vapor lamp, KrF excimer laser beam, ArF excimer laser beam, F2 excimer laser beam, extreme ultraviolet (EUV) ray, and low acceleration voltage-electron beams, and thus it contributes to efficient decomposition of the second block.

Since decomposition and polymerization are opposite reactions, it is difficult to synthesize a polymer having a degradable main chain by polymerization. When the inventors have examined living anionic polymerization of a polymer substituted with halogen at the α-position, they have found that it is not impossible to increase the molecular weight but it is difficult to industrially synthesize a large amount of polymers. On the other hand, poly α-methylstyrene which is polystyrene substituted with a methyl (hydrocarbon) group at the α-position, for example, is easily subjected to living polymerization, and thus, preferred from an industrial viewpoint.

A substituent for controlling a microphase separation by controlling surface energy, solubility parameter or interaction parameter χ, or a protective group for controlling dissolution at the development may be introduced into the benzene ring as a functional group.

The first block has a high carbon density because it has a side chain to which an alicyclic hydrocarbon group or a hydrocarbon group comprising a tertiary carbon is introduced. Therefore, the block has sufficient resistance to an etching process such as reactive ion etching and milling and a doping process such as ion implantation. The hydrocarbon group comprising a tertiary carbon has a property that it is decomposed to be transformed into carboxylic acid when heated in the presence of an acid catalyst, which property is suitable for patterning. Since it is required that the main chain of the first block is not decomposed by irradiation with an energy beam, polyacrylate has hydrogen at the α-position is preferred for the first block. Since polymethacrylate having methyl at the α-position has significantly low sensitivity to an energy beam as compared with the second block such as poly α-methylstyrene, it is possible to achieve a high contrast between the two blocks by appropriately selecting the exposure amount.

Examples of the alicyclic hydrocarbon group include cyclobutane ring, cyclopentane ring, cyclohexane ring, cycloheptane ring, cyclooctane ring, tricyclodecane ring, and one obtained by introducing cross-linking hydrocarbon into those rings; spiro rings such as spiroheptane and spirooctane; terpene rings such as a norbornane ring, an isobornane ring, an adamantane ring, a bornane ring, and a menthonaphtene ring; steroids such as thujane, sabinene, faucet, karren, pinane, cholesteric ring; bile acid, a camphor ring, a sesquiterpene ring, a diterpene ring, a triterpene ring, and steroid saponins.

Patterns with a high contrast can be formed by using the method comprising: applying to a substrate the block copolymer comprising the first block comprising polyacrylate or polymethacrylate having a side chain to which an alicyclic hydrocarbon group or a hydrocarbon group comprising a tertiary carbon is introduced and the second block comprising polystyrene substituted with hydrocarbon or halogen at an α-position; causing the block copolymer to be phase-separated; irradiating the block copolymer with a high energy beam to decompose the second block; and removing the second block by development to leave the first block. Further, the underlying substrate can be processed by dry etching using the patterns of the remaining first block as masks. As a result, for example, line-and-space patterns with a half-pitch of approximately 50 nm can be formed in the region irradiated with the energy beam. Additionally, the block copolymer can be synthesized relatively easily and exhibits sufficient sensitivity to i-line and KrF and ArF excimer laser beams.

Taking manufacturing of semiconductor devices into consideration, it is preferable that the block copolymer can form not only patterns in accordance with the phase-separated structure but also desired patterns regardless of the phase-separated structure.

In order to form the desired patterns regardless of the phase-separated structure, it is conceivable that a substituent capable of changing polarity is introduced into the side chain of the block copolymer. For example, a hydrophilic group is introduced into the side chain of the block polymer, the hydrophilic group is protected with a hydrophobic dissolution-inhibiting group to an alkali developer, and a photo-acid generator (PAG) is added. The block polymer is modified to be hydrophilic by introducing a hydroxyl group or a carboxyl group into the benzene ring of the second block or the alicyclic hydrocarbon group of the first block, or introducing a carboxyl group into polyacrylate or polymethacrylate. In the case of poly α-methylstyrene as the second block, it is conceivable that a phenol group is prepared by adding a hydroxyl group to the benzene ring and the hydroxyl group is protected by a tertiary-butyl group or a tert-butoxycarbonyl group. In the case of polyacrylate or polymethacrylate as the first block, it is conceivable that a carboxyl group is introduced into the alicyclic hydrocarbon group in the side chain and the carboxyl group is protected by a tertiary-butyl group or a tetrahydro pyranyl (THP) group. When such a block polymer is subjected to pattern exposure, an acid is generated from the photo-acid generator in the exposed region and the dissolution-inhibiting group is eliminated, making it possible to be dissolved in the alkali developer. As a result, patterns can be formed by exposure and development using the alkali developer regardless of the phase-separated structure of the block copolymer. This allows the whole block copolymer to function as a positive resist.

Examples of the dissolution-inhibiting group include esters such as t-butyl ester, isopropyl ester, ethyl ester, methyl ester, and benzyl ester; ethers such as tetrahydropyranyl ether; alkoxy carbonates such as t-butoxy carbonate, methoxy carbonate, and ethoxy carbonate; silyl ethers such as trimethylsilyl ether, triethylsilyl ether, and triphenylsilyl ether; esters such as isopropyl ester, tetrahydropyranyl ester, tetrahydrofuranyl ester, methoxyethoxy methyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 2-alkyl-1,3-oxazoline, 4-alkyl-5-oxo-1,3-oxazoline, and 5-alkyl-4-oxo-1,3-dioxolane; ethers such as t-butoxycarbonyl ether, t-butoxy-methyl ether, 4-pentenyloxymethyl ether, tetrahydropyranyl ether, tetrahydro-thiopyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxane-2-yl ether, tetrahydrofuranyl ether, tetrahydrothiofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylsesquisilyl ether, and t-butyldimethylsilyl ether; acetals such as methylene acetal, ethylidene acetal, and 2,2,2-trichloroethylidene acetal; ketals such as 1-t-butylethylidene ketal, isopropylidene ketal (acetonide), cyclopentylidene ketal, cyclohexylidene ketal, and cycloheptylidene ketal; cyclic orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester, and 2-oxacyclopentylidene orthoester; silyl ketene acetals such as trimethylsilyl ketene acetal, triethylsilyl ketene acetal, and t-butyldimethylsilyl ketene acetal; silyl ethers such as di-t-butylsilyl ether, 1,3-1',1',3',3'-tetraisopropyldisiloxanylidene ether, and tetra-t-butoxy-disiloxane-1,3-diylidene ether; acyclic acetals and ketals such as dimethyl acetal, dimethyl ketal, bis-2,2,2-trichloroethyl acetal, bis-2,2,2-trichloroethyl ketal, diacetyl acetal, and diacetyl ketal; cyclic acetals and ketals such as 1,3-dioxane, 5-methylene-1,3-dioxane, 5,5,-dibromo-1,3-dioxane, 1,3-dioxolane, 4-bromomethyl-1,3-dioxolane, 4-3'-butenyl-1,3-dioxolane, and 4,5-dimethoxymethyl-1,3-dioxolane; and cyanohydrins such as O-trimethylsilyl cyanohydrin, O-1-ethoxyethyl cyanohydrin and O-tetrahydropyranyl cyanohydrin.

Examples of the photo-acid generator (PAG) include aryl onium salts, naphthoquinonediazide compounds, diazonium salts, sulfonate compounds, sulfonium compounds, sulfamide compounds, iodonium compounds, and sulfonyldiazomethane compounds. Specific examples of these compounds include triphenylsulfonium triflate, diphenyliodonium triflate, 2,3,4,4-tetrahydroxy-benzophenone-4-naphthoquinonediazidesul fonate, 4-N-phenylamino-2-methoxyphenyldiazoniumsulfate, 4-N-phenylamino-2-methoxyphenyldiazonium p-ethylphenylsulfate, 4-N-phenylamino-2-methoxyphenyldiazonium 2-naphthylsulfate, 4-N-phenylamino-2-methoxyphenyldiazoniumphenylsulfate, 2,5-diethoxy-4-N-4'-methoxyphenylcarbonylphenyldiazonium-3-carboxy-4-hydroxyphenyl-sulfate, 2-methoxy-4-N-phenylphenyldiazonium-3-carboxy-4-hydroxyphenylsulfate, diphenylsulfonylmethane, diphenylsulfonyldiazomethane, diphenyldisulfone, α-methylbenzointosylate, pyrogallol trimesylate, benzointosylate, MPI-103 (manufactured by Midori Kagaku Co., Ltd., CAS.No. [87709-41-9]), BDS-105 (manufactured by Midori Kagaku Co., Ltd., CAS.No. [145612-66-4]), NDS-103 (manufactured by Midori Kagaku Co., Ltd., CAS.No. [110098-97-0]), MDS-203 (manufactured by Midori Kagaku Co., Ltd., CAS.No. [127855-15-5]), Pyrogallol tritosylate (manufactured by Midori Kagaku Co., Ltd., CAS No. 20032-64-8), DTS-102 (manufactured by Midori Kagaku Co., Ltd., CAS.No. [75482-18-7]), DTS-103 (manufactured by Midori Kagaku Co., Ltd., CAS.No. [71449-78-0]), MDS-103 (manufactured by Midori Kagaku Co., Ltd., CAS.No. [127279-74-7]), MDS-105 (manufactured by Midori Kagaku Co., Ltd., CAS.No. [116808-67-4]), MDS-205 (manufactured by Midori Kagaku Co., Ltd., CAS.No. [81416-37-7]), BMS-105 (manufactured by Midori Kagaku Co., Ltd., CAS.No. [149934-68-9]), TMS-105 (manufactured by Midori Kagaku Co., Ltd., CAS.No. [127820-38-6]), NB-101 (manufactured by Midori Kagaku Co., Ltd., CAS.No. [20444-09-1]), NB-201 (manufactured by Midori Kagaku Co., Ltd., CAS.No. [4450-68-4]), DNB-101 (manufactured by Midori Kagaku Co., Ltd., CAS.No. [114719-51-6]), DNB-102 (manufactured by Midori Kagaku Co., Ltd., CAS.No. [131509-55-2]), DNB-103 (manufactured by Midori Kagaku Co., Ltd., CAS.No. [132898-35-2]), DNB-104 (manufactured by Midori Kagaku Co., Ltd., CAS.No. [132898-36-3]), DNB-105 (manufactured by Midori Kagaku Co., Ltd., CAS.No. [132898-37-4]), DAM-101 (manufactured by Midori Kagaku Co., Ltd., CAS.No. [1886-74-4]), DAM-102 (manufactured by Midori Kagaku Co., Ltd., CAS.No. [28343-24-0]), DAM-103 (manufactured by Midori Kagaku Co., Ltd., CAS.No. [14159-45-6]), DAM-104 (manufactured by Midori Kagaku Co., Ltd., CAS.No. [130290-80-1]), CAS.No. [130290-82-3], DAM-201 (manufactured by Midori Kagaku Co., Ltd., CAS.No. [28322-50-1]), CMS-105 (manufactured by Midori Kagaku Co., Ltd.), DAM-301 (manufactured by Midori Kagaku Co., Ltd., CAS.No. [138529-81-4]), SI-105 (manufactured by Midori Kagaku Co., Ltd., CAS.No. [34694-40-7]), NDI-105 (manufactured by Midori Kagaku Co., Ltd., CAS.No. [133710-62-0]), and EPI-105 (manufactured by Midori Kagaku Co., Ltd., CAS. No. [135133-12-9]).

The aforementioned pattern forming material which functions as the positive resist is usually prepared as a varnish by dissolving a block copolymer obtained by introducing a hydrophilic group and a dissolution-inhibiting group and adding the photo-acid generator thereto in an organic solvent and filtering it. Examples of the organic solvent include ketone-based solvents such as cyclohexane, acetone, methyl ethyl ketone, and methyl isobutyl ketone; cellosolve-based solvents such as methyl cellosolve, methyl cellosolve acetate, ethyl cellosolve acetate, and butyl cellosolve acetate; ester-based solvents such as ethyl acetate, butyl acetate, isoamyl acetate, and γ-butyrolactone; glycol-based solvents such as propylene glycol monomethyl ether acetate; dimethyl sulfoxide; nitrogen-comprising solvents such as hexamethylphosphoric triamide dimethylformamide and N-methylpyrrolidone; and solvent mixtures obtained by adding dimethyl sulfoxide, dimethylformaldehyde, N-methylpyrrodinone or the like to those solvents in order to improve the solubility. Further, propionic acid derivatives such as methyl methylpropionate, lactic esters such as ethyl lactate, PGMEA (propylene glycol monomethyl ether acetate) and the like do not have high toxicity, so that they can also be preferably used. These solvents can be used alone or in combination with two or more solvents. Aliphatic alcohols such as isopropyl alcohol, ethyl alcohol, methyl alcohol, butyl alcohol, n-butyl alcohol, s-butyl alcohol, t-butyl alcohol, and isobutyl alcohol or aromatic solvents such as toluene and xylene may be added.

EXAMPLES

Hereinafter, Examples will be described.

Example 1

Synthesis of Block Copolymer (PαMS-b-PAdA) of Poly α-methylstyrene (PαMS) and Poly Adamantyl Acrylate (PAdA)

Tetrahydrofuran (THF) as a polymerization solvent is purified using a molecular sieve, a sodium mirror, and vacuum deaeration under cooling. As a second monomer that forms the second block, α-methylstyrene monomer is purified using calcium hydride, a Grignard reagent, vacuum deaeration under cooling, and distillation. As a first monomer that forms the first block, adamantyl acrylate monomer is purified using triethyl aluminum, vacuum deaeration under cooling, and distillation.

Glass tubes into which the purified monomers are charged are connected to a flask. The flask is filled with purified THF by distillation. Secondary-butyl lithium (sec-BuLi) as a polymerization initiator is added to THF in the flask. The whole flask is cooled to −78° C. The α-methylstyrene monomer, the second monomer, is supplied into the flask, followed by living anionic polymerization for 2 hours. Then, the adamantyl acrylate monomer, the first monomer, is supplied into the flask, followed by living anionic polymerization for 2 hours. Thereafter, the reaction is terminated by adding methanol.

The reaction mixture is poured into a large amount of methanol to precipitate a product, followed by drying to obtain a block copolymer PαMS-b-PAdA. The molecular weight of block copolymer to be measured by gel permeation chromatography (GPC) using THF as a developer is 110 kg/mol by polystyrene equivalent. When the copolymer is analyzed by nuclear magnetic resonance (NMR), a composition ratio of PαMS to PAdA is 68 mol: 32 mol (59 wt %:41 wt %). The block copolymer PαMS-b-PAdA is represented by the following Formula (1).

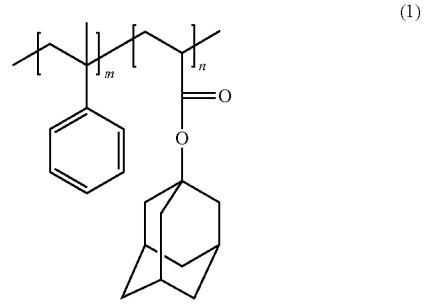

(1)

Subsequently, an example in which patterns are formed using the above block copolymer will be described with reference to FIGS. 1A to 1E.

[Formation of Underlayer Film]

As shown in FIG. 1A, the silicon wafer 11 is provided as a substrate. As a material for an underlayer film, a random copolymer PS-r-PMMA of polystyrene and polymethacrylate (P3450-SMMAran-OHT available from Polymer Source, Inc.) terminated with an OH group is provided. A 3% toluene solution of the random copolymer is prepared and the silicon wafer 11 is spin-coated with the toluene solution. Annealing is performed in a nitrogen atmosphere at 140° C. for 40 hours using a non-oxidizing oven to couple the OH group at the terminal of the random copolymer PS-r-PMMA to the surface of the silicon wafer 11. The wafer is rinsed with toluene and an excessive amount of the random copolymer is removed to form the underlayer film 12 made of a monolayer film of the random copolymer with a thickness of one to several nm.

As shown in FIG. 1B, an electron beam resist (ZEP-520A-7, Zeon Corporation) is applied to the underlayer film 12, and the electron beam resist is exposed to an electron beam through the reticle 21 into patterns corresponding to line-and-space patterns with a half-pitch of 50 nm at an accelerating voltage of 30 keV and a dose of 60 µC. Reactive ion etching (RIE) using oxygen is performed at 10 W for 10 seconds. As a result, the exposed portion of the electron beam resist and the corresponding regions of the underlayer film 12 are removed in which regions OH groups are formed on the surface of the silicon wafer 11. Thereafter, the remaining electron beam resist is removed. As a result, the exposed regions of the electron beam resist and the corresponding regions of the underlayer film 12 are removed where OH groups are formed on the surface of the silicon wafer 11.

[Coating and Phase Separation of Block Copolymer]

A 3% toluene solution of a block copolymer PαMS-b-PAdA (1) is prepared and applied to the silicon wafer 11 shown in FIG. 1B. The silicon wafer 11 is baked on a hot plate at 100° C. for 90 seconds, followed by annealing in a nitrogen atmosphere at 200° C. for 4 hours using a non-oxidizing oven. The oxygen concentration during annealing is less than 10 ppm. As a result, the block copolymer layer 13 is microphase-separated into a lamellar structure in accordance with the patterns of FIG. 1B. As shown in FIG. 1C, patterns of the first block (PAdA) 13a and the second block (PαMS) 13b, corresponding to the line-and-space patterns with a half-pitch of 50 nm, are formed.

[Patterning]

As shown in FIG. 1D, the block copolymer layer 13 is irradiated with an ArF excimer laser beam with a wavelength of 193 nm at 200 mJ/cm² through the reticle 22 having a blank portion in the region where the line-and-space patterns are intended to be formed (the region corresponding to the central part of the silicon wafer 11 illustrated). As a result, PαMS, the second block 13b, is decomposed in the exposed region.

As shown in FIG. 1E, the wafer is immersed in the isopropyl alcohol developer. Consequently, PAdA, the first block 13a, is left in the exposed region and line-and-space patterns with a half-pitch of 50 nm are obtained.

Although adamantane is used as the alicyclic hydrocarbon group in order to exert dry-etching resistant properties in this example, other alicyclic hydrocarbon groups such as isobornane, norbornane, and tricyclodecane may be used.

Example 2

Synthesis of Block Copolymer of (α-methyl-4-hydroxystyrene)-t-buthyldimethyl Silane and Adamantyl Methylethyl Acrylate 4-Isopropenylphenol and imidazole are dissolved in dry DMF. A solution of t-butyldimethylsilyl chloride dissolved in DMF is added dropwise thereto at 0° C. After the reaction mixture is reacted at 0° C. for 1 hour, the resultant solution is reacted at room temperature for 3 hours. The product is washed with ether, distilled water, a 10% NaOH aqueous solution, and distilled water and the ether phase is dried with MgSO$_4$. After filtration, ether is distilled off and the product is purified by distillation at 78° C./1.0 mmHg to obtain (α-methyl-4-hydroxystyrene)-t-buthyldimethyl silane. Since the monomer forms the second block, it is referred to as the second monomer.

In accordance with methods described in Proceedings of SPIE, Volume 3999, p.1147 (2000) and Jpn. Pat. Appln. KOKAI Publication No. 2002-173466, a synthetic reaction of adamantyl methylethyl acrylate is performed. The reaction mixture is purified using triethyl aluminum, vacuum deaeration under cooling, and distillation to obtain adamantyl methylethyl acrylate. Since the monomer forms the first block, it is referred to as the first monomer.

Glass tubes into which the purified monomers are charged are connected to a flask. The flask is filled with purified THF by distillation. Lithium phthalide as a polymerization initiator is added to THF in the flask. The whole flask is cooled to −78° C. The second monomer is added to the flask, then the solution changes in color from green to red. The resultant solution is subjected to living anionic polymerization for about 2 hours. Subsequently, the first monomer is supplied to the flask, followed by living anionic polymerization for about 2 hours. Thereafter, the reaction is terminated by adding methanol.

The reaction mixture is poured into a large amount of methanol to precipitate a product, followed by drying to obtain the block copolymer (2a). The block copolymer (2a) is dissolved in dioxane, 1% hydrochloric acid is added thereto, which is stirred for 30 minutes. Thereafter, pure water is added to the reaction mixture and the precipitated solid matter is separated. The solid matter is dissolved in THF and reprecipitated twice with hexane. When the obtained block copolymer is analyzed by NMR, it is estimated that the block copolymer (2b) of poly α-methyl-4-hydroxystyrene and poly adamantyl methylethyl acrylate is synthesized.

In accordance with the method described in ACS Symposium Series, Vol. 579, pp. 165-175 (1995), a part of the phenol group of the second block that forms the block copolymer (2b) is protected with a p-t-butoxy carbonylmethyl group. As a result, a block copolymer (2c) comprising a random copolymer of p-t-butoxycarbonyl methoxy-α-methylstyrene and 4-hydroxy-α-methylstyrene as the second block and poly adamantyl methylethyl acrylate as the first block is obtained. When the copolymer is analyzed by nuclear magnetic resonance (NMR), a composition ratio of the second block to the first block is 63 wt %:37 wt %.

Subsequently, an example in which patterns are formed using the above block copolymer will be described with reference to FIGS. 2A to 2H.

[Formation of Underlayer Film]

An underlayer film is formed in the same manner as in Example 1.

As shown in FIG. 2A, the silicon wafer 31 is provided as a substrate and the underlayer film 32 having a thickness of one to several nm made of a monolayer film of the random copolymer PS-r-PMMA is formed.

As shown in FIG. 2B, an electron beam resist (ZEP-520A-7, Zeon Corporation) is applied to the underlayer film 32, and the electron beam resist is exposed to an electron beam through the reticle 41 into patterns corresponding to line-and-space patterns with a half-pitch of 50 nm at an accelerating voltage of 30 keV and a dose of 60 pC. Reactive ion etching (RIE) using oxygen is performed at 10 W for 10 seconds. As a result, the exposed portion of the electron beam resist and the corresponding regions of the underlayer film 32 are removed in which regions OH groups are formed on the surface of the silicon wafer 31. Thereafter, the remaining electron beam resist is removed. As a result, patterns of regions where the OH groups are formed and regions where the underlayer film 32 of the random copolymer is remained are formed on the surface of the silicon wafer 31.

[Coating and Phase Separation of Block Copolymer]

A 3% toluene solution of the block copolymer (2c) to which 1% naphthylimide triflate (NAI-105: manufactured by Midori Kagaku Co., Ltd.) is added as the photo-acid generator is prepared and applied to the silicon wafer 31 shown in FIG. 2B. The silicon wafer is baked on a hot plate at 100° C. for 90 seconds, followed by annealing in a nitrogen atmosphere at 200° C. for 4 hours using a non-oxidizing oven. The oxygen concentration during annealing is less than 10 ppm. As a result, the block copolymer layer 33 is microphase-separated into the lamellar structure in accordance with the patterns of FIG. 2B. As shown in FIG. 2C, patterns of the first block 33a comprising poly adamantyl methylethyl acrylate and the second block 33b comprising a random copolymer of p-t-butoxycarbonyl methoxy-α-methylstyrene and 4-hydroxy-α-methylstyrene, corresponding to the line-and-space patterns with a half-pitch of 50 nm, are formed.

[Patterning]

As shown in FIG. 2D, the block copolymer layer 33 is irradiated with i-line with a wavelength of 365 nm through the reticle 42 having a light shielding portion in the region where the line-and-space patterns are intended to be formed (the region corresponding to the central part of the silicon wafer 31 illustrated). As a result, acids are generated from the photo-acid generator in the exposed region shown in FIG. 2E (the region corresponding to the peripheral portion of the silicon wafer 31 illustrated). The silicon wafer 31 is baked on a hot plate at 160° C. for 90 seconds. During baking, through the catalytic reaction by acids generated from the photo-acid generator, the t-butoxycarbonylmethyl group introduced into the side chain of the second block is decomposed, and then the adamantyl methylethyl group is eliminated from the first block, thereby the block copolymer (2d) is produced. As shown in FIG. 2F, when development is performed for 60 seconds using a solution of 2.38% tetrahydro ammonium hydroxide (TMAH) as an alkali developer, the block copolymer in the region exposed to the i-line is removed.

As shown in FIG. 2G, the block copolymer layer 33 is irradiated with an ArF excimer laser beam with a wavelength of 193 nm at 200 mJ/cm² through the reticle 43 having a blank portion in the region where the line-and-space patterns are intended to be formed (the region corresponding to the central part of the silicon wafer 31 illustrated). As a result, the second block 33b is decomposed in the exposed region. Here, the ArF excimer laser beam does not generate acids from the photo-acid generator.

As shown in FIG. 2H, the wafer is immersed in the isopropyl alcohol developer. Consequently, the first block 33a is left in the exposed region and the line-and-space patterns with a half-pitch of 50 nm are obtained.

The reaction scheme of the block copolymer in this example is shown in the following Formula.

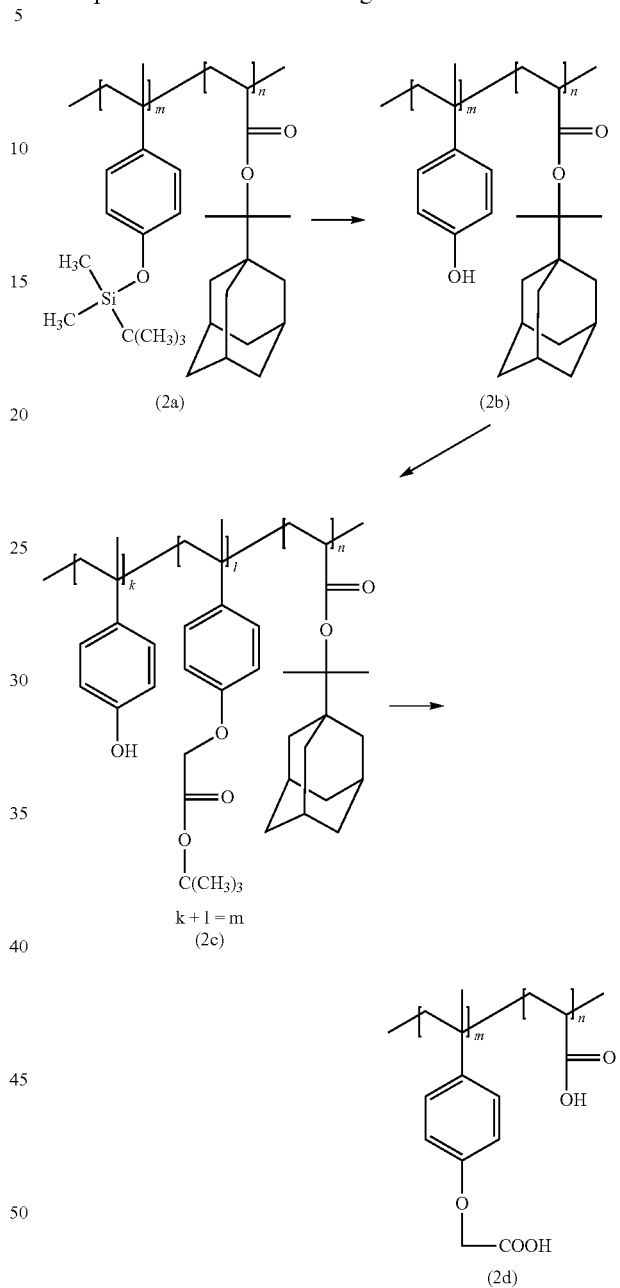

Although adamantane is also used as an alicyclic hydrocarbon group in order to exert dry-etching resistant properties in this example, other alicyclic hydrocarbon groups such as isobornane, norbornane, and tricyclodecane may be used.

In this example, naphthylimide triflate is used as the photo-acid generator and exposure to the i-line with a wavelength of 365 nm is performed in FIG. 2D. However, triphenylsulfonium triflate and diphenyliodonium triflate sensitive to KrF excimer laser beams with a wavelength of 248 nm and ArF excimer laser beams with a wavelength of 193 nm may be used, and exposure to KrF or ArF excimer laser beam may be performed.

Example 3

Synthesis of Block Copolymer of p-t-butoxycarbonyl-α-methylstyrene and t-butyl acrylate As the second monomer that forms the second block, p-t-butoxycarbonyl-α-methylstyrene is provided. As the first monomer that forms the first block, t-butyl acrylate is provided.

Glass tubes into which the purified monomers are charged are connected to a flask. The flask is filled with purified THF by distillation. Lithium phthalide as a polymerization initiator is added to THF in the flask. The whole flask is cooled to −78° C. The second monomer is added to the flask, then the solution changes in color from green to red. The resultant solution is subjected to living anionic polymerization for about 2 hours. Subsequently, the first monomer is supplied to the flask, followed by living anionic polymerization for about 2 hours. Thereafter, the reaction is terminated by adding methanol.

The reaction mixture is poured into a large amount of methanol to precipitate a product, followed by drying to obtain the block copolymer (3a). The molecular weight of the block copolymer to be measured by gel permeation chromatography (GPC) using THF as a developer is 130 kg/mol by polystyrene equivalent. When the block copolymer analyzed by nuclear magnetic resonance (NMR), a composition ratio of the second block to the first block is 61 wt %:39 wt %.

Subsequently, an example in which patterns are formed using the above block copolymer in the same manner as described in FIGS. 2A to 2H will be described.

[Formation of Underlayer Film]

An underlayer film is formed in the same manner as in Example 1.

In the same manner as described in FIG. 2A, the silicon wafer 31 is provided as a substrate and the underlayer film 32 having a thickness of one to several nm made of a monolayer film of the random copolymer PS-r-PMMA is formed. In the same manner as described in FIG. 2B, by performing coating with an electron beam resist, pattern exposure, oxygen RIE, and removal of the remaining electron beam resist, patterns of regions where the OH groups are formed on the surface of the silicon wafer 31 and regions where the underlayer film 32 of the random copolymer is remained are formed.

[Coating and Phase Separation of Block Copolymer]

A 3% toluene solution of the block copolymer (3a) to which 1% naphthylimide triflate (NAI-105: manufactured by Midori Kagaku Co., Ltd.) is added as the photo-acid generator is prepared and applied to the silicon wafer 31 shown in FIG. 2B. The silicon wafer is baked on a hot plate at 100° C. for 90 seconds, followed by annealing in a nitrogen atmosphere at 200° C. for 4 hours using a non-oxidizing oven. The oxygen concentration during annealing is less than 10 ppm. As a result, the block copolymer layer 33 is microphase-separated into the lamellar structure in accordance with the patterns of FIG. 2B. As shown in FIG. 2C, patterns of the first block 33a comprising t-butyl acrylate and the second block 33b comprising p-t-butoxycarbonyl-α-methylstyrene, the line-and-space patterns with a half-pitch of 50 nm, are formed.

[Patterning]

As shown in FIG. 2D, the block copolymer layer 33 is irradiated with i-line with a wavelength of 365 nm through the reticle 42 having a light shielding portion in the region where the line-and-space patterns are intended to be formed (the region corresponding to the central part of the silicon wafer 31 illustrated). As a result, acids are generated from the photo-acid generator in the exposed region shown in FIG. 2E (the region corresponding to the peripheral portion of the silicon wafer 31 illustrated). The silicon wafer 11 is baked on a hot plate at 160° C. for 90 seconds. During baking, through the catalytic reaction of acids generated from the photo-acid generator, the t-butyl group introduced into the side chain of block copolymer is decomposed, thereby the block copolymer (3b) is produced. As shown in FIG. 2F, when development is performed for 60 seconds using a solution of 2.38% tetrahydro ammonium hydroxide (TMAH) as an alkali developer, the block copolymer in the region exposed to the i-line is removed.

As shown in FIG. 2G, the block copolymer layer 33 is irradiated with an ArF excimer laser beam with a wavelength of 193 nm at 200 mJ/cm$^2$ through the reticle 43 having a blank portion in the region where the line-and-space patterns are intended to be formed (the region corresponding to the central part of the silicon wafer 31 illustrated). As a result, the second block 33b is decomposed in the exposed region.

As shown in FIG. 2H, the wafer is immersed in the isopropyl alcohol developer. Consequently, the first block 33a is left in the exposed region and the line-and-space patterns with a half-pitch of 50 nm are obtained.

The reaction scheme of the block copolymer in this example is shown in the following Formula.

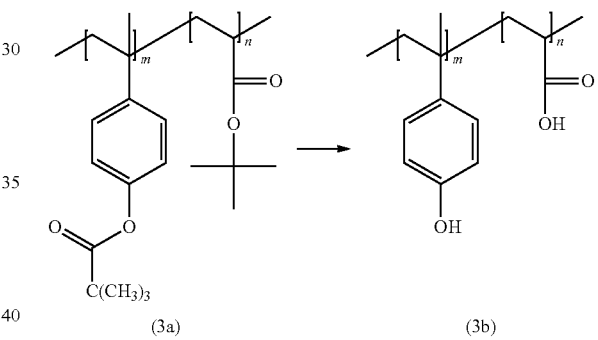

(3a)                    (3b)

Although t-butyl acrylate which is relatively easy to polymerize is used as the first monomer that forms the first block in this example, use of polyacrylate into which an alicyclic hydrocarbon group is introduced like Examples 1 and 2 makes it possible to improve dry etching resistance. In the case where methacrylate is used in place of acrylate, the same result is obtained.

The decomposition temperature of the t-butyl group added to the phenol group by an acid is lower by several tens of Celsius degrees than that of the t-butyl group added to acrylate by the acid. Thus, by decomposing the t-butyl group added to the phenol group by acid in advance, microphase-separation of the block copolymer may be made easy.

Although the t-butyl group is used as the dissolution-inhibiting group in order to change the solubility of the block copolymer in the alkali developer (TMAH solution), a tetrahydropyranyl group may be used in place of the t-butyl group.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern comprising:
applying a block copolymer to a substrate, the block copolymer comprising a first block and a second block, the first block comprising polyacrylate or polymethacrylate having a side chain to which an alicyclic hydrocarbon group or a hydrocarbon group comprising a tertiary carbon is introduced, and the second block comprising polystyrene substituted with hydrocarbon or halogen at an α-position;
causing the block copolymer to be phase-separated;
irradiating the block copolymer with a high energy beam to decompose the second block; and
removing the second block with a developer to form a pattern of the first block.

2. The method according to claim 1, wherein the first block comprises polyacrylate or polymethacrylate having a side chain to which an alicyclic hydrocarbon group is introduced via a hydrocarbon group comprising a tertiary carbon.

3. The method according to claim 1, wherein the alicyclic hydrocarbon group is selected from the group consisting of adamantyl, isobornyl, norbornyl, and tricyclodecyl.

4. The method according to claim 1, wherein a substituent selected from the group consisting of a hydroxyl group and a carboxyl group, which are protected by a dissolution-inhibiting group, is introduced into the polystyrene in the second block or the alicyclic hydrocarbon group in the first block.

5. The method according to claim 4, further comprising: adding a photo-acid generator to the block copolymer; selectively irradiating the block copolymer with light to generate an acid from the photo-acid generator and to eliminate the dissolution-inhibiting group; and causing a part of the block copolymer where the dissolution-inhibiting group is eliminated to be dissolved in an alkali developer.

6. The method according to claim 1, further comprising: forming a guide pattern on the substrate before applying the block copolymer.

7. The method according to claim 1, wherein the high energy beam is an electron beam or an ultraviolet ray.

8. The method according to claim 7, wherein an accelerating voltage of the electron beam ranges from 1 to 30 keV.

9. The method according to claim 7, wherein the ultraviolet ray is a KrF or ArF excimer laser beam.

* * * * *